(12) United States Patent
Bayliss et al.

(10) Patent No.: US 8,976,531 B2
(45) Date of Patent: Mar. 10, 2015

(54) TRANSLATING EQUIPMENT RACK SYSTEM

(75) Inventors: Andrew John Bayliss, Maryville, WA (US); Perry Nicholas Rea, Everett, WA (US); Kevin Matthew Retz, Bothell, WA (US)

(73) Assignee: The Boeing Company, Chicago, IL (US)

( * ) Notice: Subject to any disclaimer, the term of this patent is extended or adjusted under 35 U.S.C. 154(b) by 523 days.

(21) Appl. No.: 12/985,033

(22) Filed: Jan. 5, 2011

(65) Prior Publication Data
US 2012/0170227 A1 Jul. 5, 2012

(51) Int. Cl.
| | | |
|---|---|---|
| H05K 5/00 | (2006.01) | |
| H05K 7/00 | (2006.01) | |
| A47G 1/10 | (2006.01) | |
| A47B 96/06 | (2006.01) | |
| E05C 5/02 | (2006.01) | |
| H05K 7/14 | (2006.01) | |
| B64C 1/14 | (2006.01) | |
| B64C 1/22 | (2006.01) | |
| B64D 43/00 | (2006.01) | |
| B64D 47/00 | (2006.01) | |

(52) U.S. Cl.
CPC ............ H05K 7/1411 (2013.01); B64C 1/1446 (2013.01); B64C 1/22 (2013.01); B64D 43/00 (2013.01); B64D 47/00 (2013.01)
USPC ........... 361/727; 361/725; 361/726; 361/728; 361/731; 361/732; 361/679.42; 248/220.31; 292/8; 292/4

(58) Field of Classification Search
CPC ..... G06F 1/16; G06F 1/33225; H05K 5/0026; H05K 5/026; H05K 2201/10459

USPC ........................ 361/679.01–679.04, 688–747, 361/679.01–679.09, 679.1–679.19, 361/679.21–679.29, 679.31–679.45, 361/679.55–679.6; 312/223.1, 223.2, 312/223.3, 331; 248/298.1, 274.1, 122.1, 248/917–924, 80–88, 155.1–155.5, 248/166–173, 180.1–186.2, 229.1–231.51, 248/271.4, 292.14, 316.1–316.8; 292/1–62, 292/113, 169.11–169.23, 341.11–341.19
See application file for complete search history.

(56) References Cited

U.S. PATENT DOCUMENTS

| | | | |
|---|---|---|---|
| 2,242,201 A | * | 5/1941 | Woods ....................... 244/129.5 |
| 2,938,686 A | | 5/1960 | Van Winkle et al. |
| 3,028,130 A | | 4/1962 | Burton |
| 4,153,225 A | | 5/1979 | Paulsen |

(Continued)

FOREIGN PATENT DOCUMENTS

| | | |
|---|---|---|
| EP | 1876875 A2 | 1/2008 |
| WO | WO9418068 A1 | 8/1994 |

OTHER PUBLICATIONS

EP search report dated May 14, 2012 regarding application 1193569. 8-1232, applicant reference NAM/P119904EP00, Applicant the Boeing Company, 5 Pages.

(Continued)

*Primary Examiner* — Jerry Wu
(74) *Attorney, Agent, or Firm* — Yee & Associates, P.C.

(57) ABSTRACT

A method and apparatus for an accessible equipment rack system. A mounting frame having a set of transport elements and a translation mechanism is connected to a translating equipment rack. The translation mechanism moves the translating equipment rack to enable access to said translating equipment rack from an exterior area.

6 Claims, 11 Drawing Sheets

(56) References Cited

U.S. PATENT DOCUMENTS

| | | | |
|---|---|---|---|
| 4,763,859 A | 8/1988 | Biagini | |
| 5,026,595 A | 6/1991 | Crawford, Jr. et al. | |
| 5,241,722 A * | 9/1993 | Rohrlick et al. | 14/71.5 |
| 5,590,022 A * | 12/1996 | Harvey | 361/679.41 |
| 5,639,535 A | 6/1997 | McCarville | |
| 5,789,061 A | 8/1998 | Campbell et al. | |
| 5,810,178 A | 9/1998 | Boette et al. | |
| 5,827,383 A | 10/1998 | Campbell et al. | |
| 6,070,742 A * | 6/2000 | McAnally et al. | 211/26 |
| 6,494,404 B1 * | 12/2002 | Meyer | 244/118.2 |
| 6,562,436 B2 | 5/2003 | George et al. | |
| 6,689,448 B2 | 2/2004 | George et al. | |
| 6,709,538 B2 | 3/2004 | George et al. | |
| 8,087,611 B2 | 1/2012 | Arnold et al. | |
| 2002/0148928 A1 | 10/2002 | Oki | |
| 2007/0258212 A1 * | 11/2007 | Malone et al. | 361/699 |
| 2008/0001031 A1 | 1/2008 | Doebertin et al. | |
| 2008/0006593 A1 | 1/2008 | Tenreiro et al. | |
| 2008/0136299 A1 | 6/2008 | Peurifoy | |
| 2009/0114770 A1 | 5/2009 | Harrington et al. | |
| 2009/0195135 A1 | 8/2009 | Nemoz et al. | |
| 2010/0162142 A1 | 6/2010 | Cooper et al. | |
| 2010/0206988 A1 | 8/2010 | Woodland | |
| 2010/0235037 A1 | 9/2010 | Vian et al. | |
| 2011/0127379 A1 | 6/2011 | Jager et al. | |
| 2012/0325960 A1 | 12/2012 | Saint-Jalmes et al. | |

OTHER PUBLICATIONS

Bayliss et al., "Translating Equipment Rack System," U.S. Appl. No. 13/102,265, filed May 6, 2011, 74 Pages.

Office Action, dated Apr. 24, 2014, regarding U.S. Appl. No. 13/102,265, 35 pages.

\* cited by examiner

TRANSLATING EQUIPMENT RACK SYSTEM

BACKGROUND INFORMATION

1. Field

The present disclosure relates generally to equipment racks. Still more particularly, the disclosure relates to a translating equipment rack system for an aircraft electronic equipment bay.

2. Background

Electronic equipment (EE) bay may be an area within the volume of an aircraft for installing avionic equipment, electrical equipment, power distribution equipment, and other electronics. The electronic equipment bay may also be referred to as an avionics bay or electrical equipment bay.

The electronic equipment bay may be located, without limitation, below the flight deck, behind the flight deck, and/or adjacent to a passenger or cargo area of an aircraft. Equipment stored in an electronic equipment bay may be accessible through a passenger area, cargo area, a hatch in the flight deck area, and/or an external hatch on an aircraft.

Equipment in the electronic equipment bay may be placed in equipment racks within the electronic equipment bay. One or more aisles may be provided between the equipment racks in the electronic equipment bay to permit maintenance personnel and other technicians to move throughout the electronic equipment bay and between the equipment racks.

For example, equipment racks in the electronic equipment bay may be placed with the front of the racks facing a central aisle that extends between the equipment racks to allow maintenance personnel access to the equipment in the racks. In-flight personnel may utilize one or more hatches in the flight deck or cabin areas to gain access to the equipment in the electronic equipment bay during a flight.

In addition, one or more outboard aisles may connect a central aisle to an external hatch to permit ground crew personnel to enter the electronic equipment bay through the external hatch. The ground crew personnel may utilize the external hatch to enter the electronic equipment bay and proceed down the aisle(s) to access the equipment rack(s) of interest for installation, removal, and/or maintenance.

Thus, the equipment racks in the electronic equipment bay may require space in the electronic equipment bay for aisles to permit human personnel access to the equipment racks, space for installing and/or removing equipment racks within the electronic equipment bay without disturbing other equipment in the electronic equipment bay, as well as the space that may actually be taken up by the equipment racks themselves.

Therefore, it would be advantageous to have a method and apparatus that takes into account one or more of the issues discussed above, as well as other issues.

SUMMARY

An embodiment of the present disclosure provides an accessible equipment rack. A mounting frame having a set of transport elements and a translation mechanism is connected to a translating equipment rack. The translation mechanism moves the translating equipment rack to enable access to the translating equipment rack from an exterior area.

In another embodiment, a high density electronics compartment of a vehicle is provided. The high density electronics compartment includes a translating equipment rack. The translating equipment rack has a set of individually mounted modular electronic equipment within the translating equipment rack. A set of translation guides is connected to the translating equipment rack. The translating equipment rack includes a rack attachment cable with cable disconnects. An exterior panel associated with a surface of the high density electronics compartment opens outward with rack translation to enable access to the translating equipment rack and the set of modular electronic equipment within the translating equipment rack. The exterior panel is secured with a closing mechanism.

In yet another advantageous embodiment, a method to access modular electronics equipment in a high density electronics compartment is provided.

A method to access modular electronics equipment in a high density electronics compartment of a vehicle. A translating equipment rack is translated out of the high density electronics compartment to allow access from an exterior area of the high density electronics compartment. Electronic equipment within the translating equipment rack is accessed from the exterior area without entering the high density electronics compartment.

In still another advantageous embodiment, an accessible equipment rack within a high density electronics compartment of an aircraft is provided. A set of modular electronic equipment is mounted within a translating equipment rack. A mounting frame having a hollow core encloses a flexible rack attachment cable. The flexible rack attachment cable includes a set of data cables, a set of power cables, and a set of cooling lines. A set of cable disconnects is connected to the flexible rack attachment cable to permit removal of translating equipment rack. A set of translation guides is connected to the translating equipment rack. The translating equipment rack is configured to be detachable from the set of translation guides and the flexible rack attachment cable to permit removal of the translating equipment rack from the aircraft. A translation mechanism moves the translating equipment rack along a translation pathway from an interior volume of the aircraft outward to an exterior area outside of the aircraft to enable access to the translating equipment rack from the exterior area. The translation pathway is at least one of a vertical pathway, a horizontal pathway, and a diagonal pathway. An exterior panel is coupled to the translating equipment rack and associated with an opening structure of an exterior surface of the aircraft. The exterior panel opens outward with rack translation. An electrically conductive shroud encloses the set of individually mounted modular electronic equipment. The shroud is electrically grounded to the aircraft to provide electromagnetic energy protection to the set of modular electronic equipment during exterior access to the translating equipment from the exterior area outside the aircraft.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
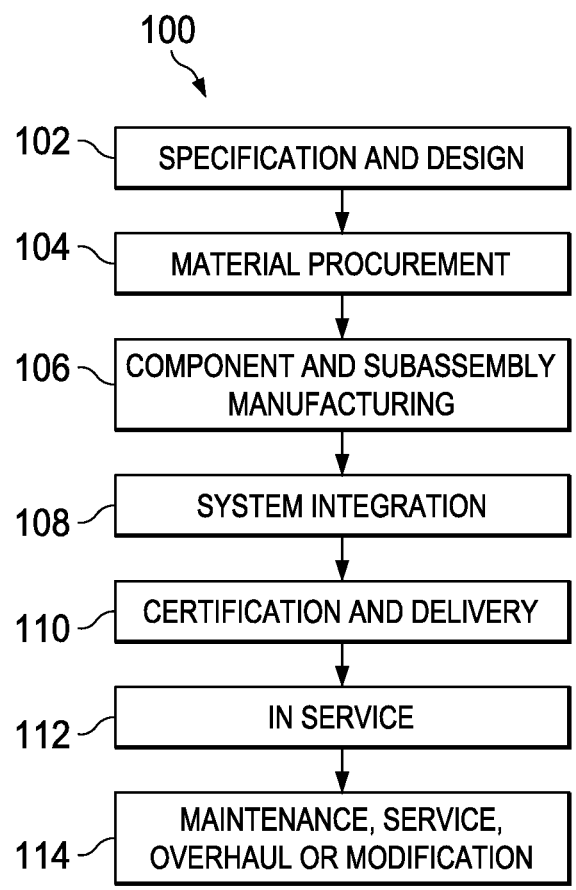
FIG. 1 is a flow diagram of an aircraft production and service methodology in accordance with an advantageous embodiment.
Figure 2:
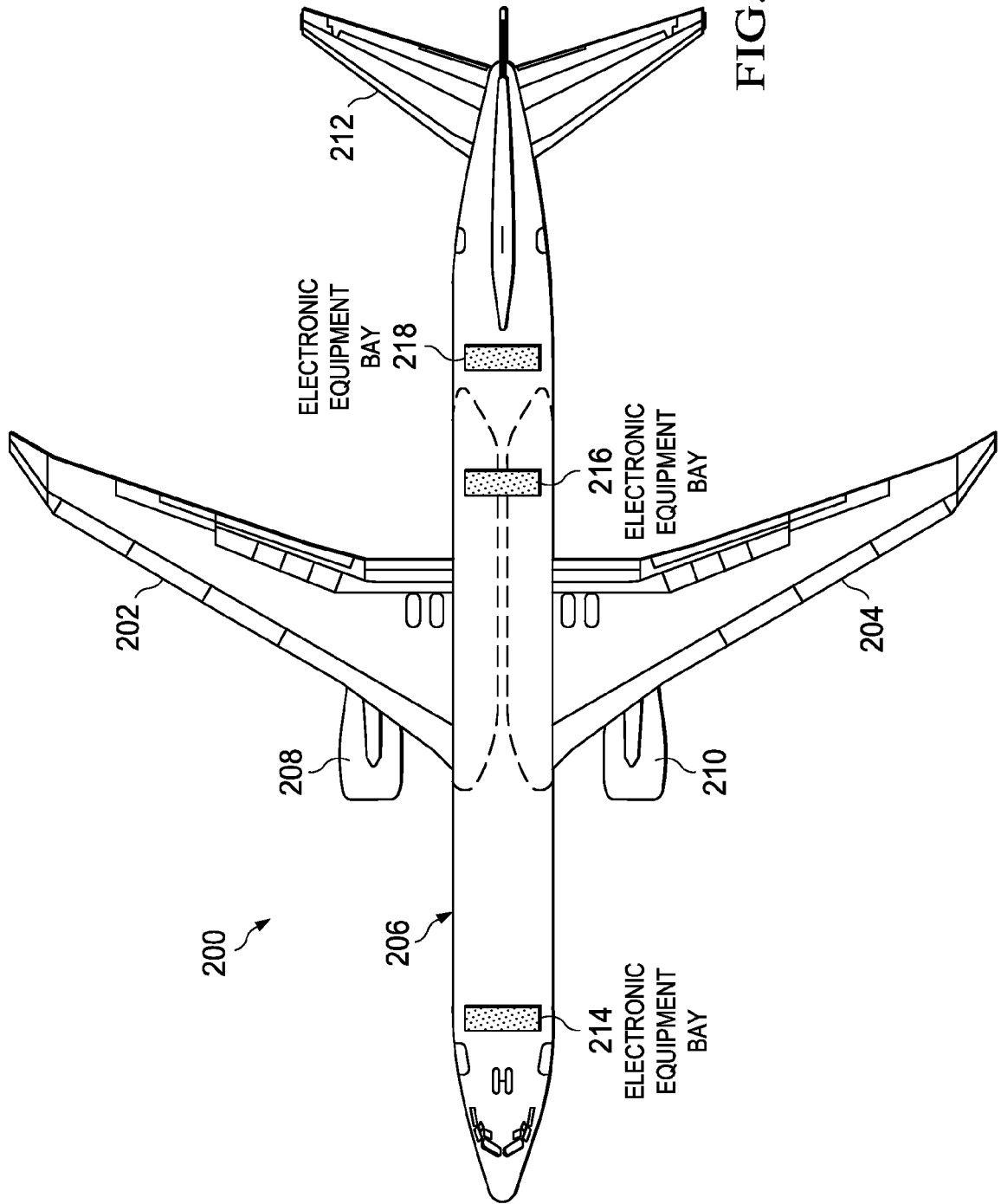
FIG. 2 is a diagram of an aircraft depicted in accordance with an advantageous embodiment.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft production and service methodology is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service 112 by a customer, aircraft 200 in FIG. 2 is scheduled for routine maintenance, service, overhaul, or modification 114, which may include modification, reconfiguration, refurbishment, scheduled maintenance, unscheduled maintenance, upgrading systems, and any other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

The different advantageous embodiments recognize and take into account a number of considerations. For example, without limitation, the different advantageous embodiments recognize and take into account that space on an aircraft may be considered an important but limited resource. The optimum payload of an aircraft may be a combination of passengers and cargo requirements for the aircraft. The advantageous embodiments recognize that it is desirable to meet or exceed the payload requirements.

The different advantageous embodiments recognize that the volume requirements for electrical equipment, racks, transport elements, as well as aisles and other empty spaces for maintenance access and build access may reduce space available for cargo. The embodiments also recognize that in current electronic equipment bays, mechanics and other personnel are not always in ergonomic friendly positions when interfacing with equipment in the electronic equipment bays.

One embodiment provides a translating equipment rack. The translating equipment rack may include a mounting frame having a set of transport elements and a translation mechanism. As used herein, the term "set" refers to one or more items, unless defined otherwise. For example, the set of transport elements may be a single transport element, as well as two or more transport elements.

A transport element may be any element that is transporting something, such as data, power, coolant, water, air, or any other substance. A transport element may be a cable, a tube, a line, or any other transport element. For example, and without limitation, a transport element may be a data cable, an electric cord, a power cable, a coolant line, a water line, an air tube, or any other type of transport element.

The translation mechanism may be electrically powered, such as, for example but without limitation, a motorized mechanism. The translation mechanism may also be a manual translation mechanism, such as, without limitation, a hand powered crank.

The translation mechanism moves the translating equipment rack along a translation pathway from an interior area of a compartment outward to an exterior area outside the compartment to enable access to the translating equipment rack from the exterior area. The translation pathway may be a vertical pathway, a horizontal pathway, or a diagonal pathway.

Another embodiment of the present disclosure provides a translating equipment rack within a high density electronics compartment. A vehicle may be any type of vehicle, including, without limitation, an aircraft or other aircraft. A high density electronics compartment may be an electronic equipment bay or any other compartment in a vehicle. The high density electronics compartment includes a translating equipment rack.

In one embodiment, the translating equipment rack has a set of individually mounted modular electronic equipment within the translating equipment rack. A set of translation guides may be connected to the translating equipment rack. As used herein, the term "set" refers to one or more items, unless otherwise defined herein. Thus, the set of translation guides may be a set of one translation guide, as well as a set of two or more translation guides.

The translating equipment rack may include a flexible rack attachment cable with cable disconnects. The flexible rack attachment cable may be a transport element, such as an umbilical or other flexible cable.

An exterior panel associated with a surface of the high density electronics compartment may be coupled to the translating equipment rack and open outward with rack translation to enable access to the translating equipment rack and the set of modular electronic equipment within the translating equipment rack. The exterior panel may be secured with a closing mechanism. A closing mechanism is any type of known or available mechanism for closing a panel, such as, without limitation, a set of latches, a set of locks, or a set of pressure seals or pressure supporting seal interface.

The advantageous embodiments are not limited to translating equipment racks that contain part of the external surface of the vehicle but also embodiments that may contain separate doors, covers, and/or hatches.

The advantageous embodiments also provide a method for accessing electronic equipment in a translating equipment rack. In one embodiment, a closing mechanism is released from an exterior panel covering an opening associated with an exterior surface of the high density electronics compartment. The exterior panel may be translated outward from the exterior surface with the attached translating equipment rack. The translating equipment rack incorporates a set of modular electronic equipment.

A face of the set of modular electronic equipment may be exposed without disconnecting a flexible rack attachment cable connected to the translating equipment rack. A flexible shroud may be removed to expose a side or a face of the equipment rack. This shroud may be a cover that works as an environmental and electrical magnetic effects (EME) cover.

Equipment in the set of modular electronic equipment within the translating equipment rack may be accessed without entering the high density electronics compartment. The features and functions are an added advantage to air vehicle design because elements of the high density equipment bay can be packaged in a smaller volume. This smaller volume packaging allows the translating racks to be located in areas of the aircraft that are too small for current equipment racks, such as a tail section of an aircraft. The smaller volume of the translating equipment rack also permits translating equipment racks to be located in areas away from engine rotor burst zones and oxygen bottles, thus providing a more desirable configuration.

With reference now to FIG. 2, a diagram of an aircraft is depicted in which an advantageous embodiment may be implemented. Aircraft 200 is an example of an aircraft in which translating equipment rack systems may be implemented. In this illustrative example, aircraft 200 has wings 202 and 204 attached to body 206. Aircraft 200 includes wing mounted engine 208, wing mounted engine 210, and tail 212.

Aircraft 200 may also include electronic equipment bays 214, 216, and 218. Electronic equipment bays 214, 216, and 218 are high density electronics compartments. Electronic equipment bays 214, 216, and 218 may have one or more translating equipment racks installed within them.

Electronic equipment bays 214 and 216 may be equipment bays in pressurized areas of aircraft 200. However, the embodiments are not limited to translating equipment racks in pressurized areas of aircraft 200. Because the translating equipment racks of the embodiments are so compact and efficient in usage of space, the translating equipment racks of the advantageous embodiments may be located in non-traditional areas on a vehicle or aircraft, such as in a tail section or other unpressurized area.

In this example, translating equipment racks of the embodiments may be located in electronic equipment bay 218 in a tail section of aircraft 200. This is an improvement over currently used equipment racks which may be too large and cumbersome to install in a tail section or other unpressurized areas of aircraft 200.

FIG. 2 is intended as an example, and not as an architectural limitation for the different advantageous embodiments. Although aircraft 200 shows three electronic equipment bays, the embodiments are not limited to installing translating equipment racks in only one or two electronic equipment bays. Moreover, the embodiments are not limited to utilizing electronic equipment bays in the exact same locations shown in FIG. 2. The advantageous embodiments may provide translating equipment racks installed in any compartment located anywhere in aircraft 200 or other type of vehicle.

Figure 3:
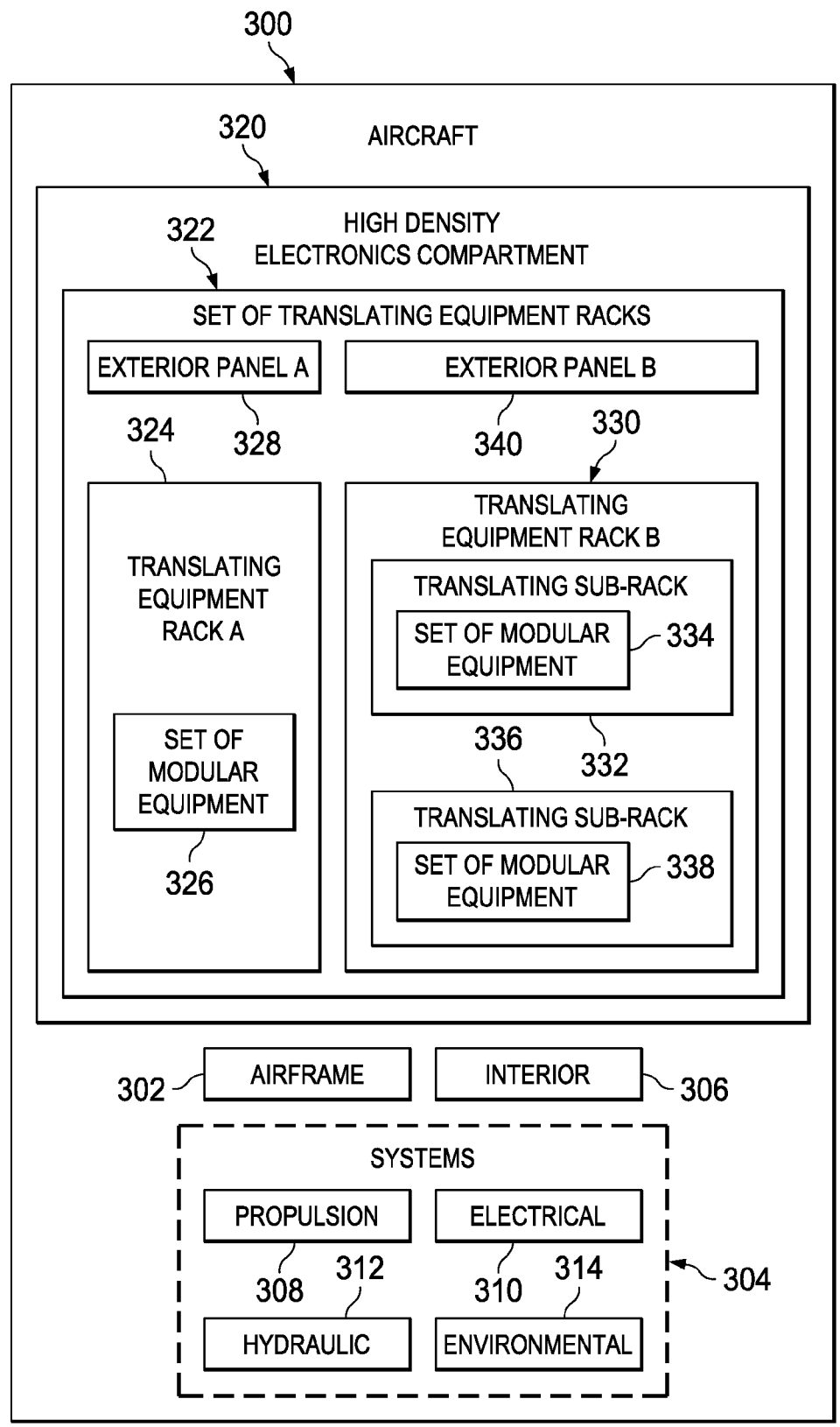
FIG. 3 is a block diagram of an aircraft in accordance with an advantageous embodiment.

With reference now to FIG. 3, a block diagram of an aircraft is depicted in which an advantageous embodiment may be implemented. In this example, aircraft 300 may be produced by aircraft manufacturing and service method 100 in FIG. 1 and may include airframe 302 with a plurality of systems 304 and interior 306. Examples of systems 304 include one or more of propulsion system 308, electrical system 310, hydraulic system 312, and environmental system 314. Any number of other systems may be included.

High density electronics compartment 320 may be an interior compartment within aircraft 300, such as, without limitation, electronic equipment bays 214, 216, and/or 218 in FIG. 2. High density electronics compartment 320 may be implemented as an electronic equipment bay or any other high density electronics compartment in aircraft 300. High density electronics compartment 320 may be a pressurized area or an unpressurized area of aircraft 300.

High density electronics compartment 320 includes set of translating equipment racks 322. Set of translating equipment racks 322 is a set of one or more translating equipment racks, such as, without limitation, translating equipment rack A 324. Translating equipment rack A 324 may be a rack mounting frame for holding set of modular equipment 326. Set of modular equipment 326 may include one or more electronic equipment and/or electrical equipment.

In this example, electrical system 310 is shown as a separate component from high density electronics compartment and set of translating equipment racks 322. However, electrical system 310 may include electrical equipment and electrical systems located within high density electronics compartment 320 and/or located within set of translating equipment racks 322.

In this embodiment, exterior panel A 328 may be an exterior panel coupled to translating equipment rack A 324 and associated with an exterior surface of aircraft 300. In another embodiment, exterior panel A 328 may be a separate door in aircraft 300 that covers translating equipment rack A 324 but is not an integral part of translating equipment rack A 324. Exterior panel A 328 opens outward to permit maintenance personnel located outside of high density electronics compartment 320 to access set of modular equipment 326 within translating equipment rack A 324.

Set of translating equipment racks 322 may also include translating equipment rack B 330 having two or more translating sub-racks mounted within translating equipment rack B 330. For example, translating equipment rack B 330 may have translating sub-rack 332 with set of modular equipment 334. Translating equipment rack B 330 may also have translating sub-rack 336 with set of modular equipment 338 within translating equipment rack 330.

In this example, when translating equipment rack B 330 may be translated outwards for exterior access, translating sub-rack 332 may be exposed and removable on a side of translating equipment rack B 330 next to the adjacent translating sub-rack 336, which remains unexposed within translating equipment rack B 330.

Exterior panel B 340 is a panel associated with translating equipment rack B 330. Exterior panel B 340 may be implemented as a panel that may be coupled to translating equipment rack B 330, a door in aircraft 300, a hatch in aircraft 300, or any other type of covering for an opening in aircraft 300.

Translating equipment rack B 330 in this example contains two translating sub-racks. However, in accordance with this advantageous embodiment, a translating equipment rack may include any number of translating sub-racks.

FIG. 3 is intended as an example, and not as an architectural limitation for the different advantageous embodiments. Although an aerospace example with aircraft 300 is shown in FIG. 3, different advantageous embodiments may be applied to other vehicles and other industries, such as, without limitation, submersible vehicles, marine vehicles, space craft, helicopters or any type of aircraft, and the automotive industry.

Apparatus and methods embodied herein may be employed during at least one of the stages of aircraft manufacturing and service method 100 in FIG. 1 or during a heavy maintenance or modification period during the aircrafts service life. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 300 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items, means one or more items. For example, a number of apparatus embodiments is one or more apparatus embodiments.

A number of apparatus embodiments, method embodiments, or a combination thereof may be utilized while aircraft 300 is in service 112 and/or maintenance, service, overhaul or modification 114 in FIG. 1. The use of a number of the different advantageous embodiments may substantially expedite the assembly of and/or reduce the cost of aircraft 300.

Figure 4:
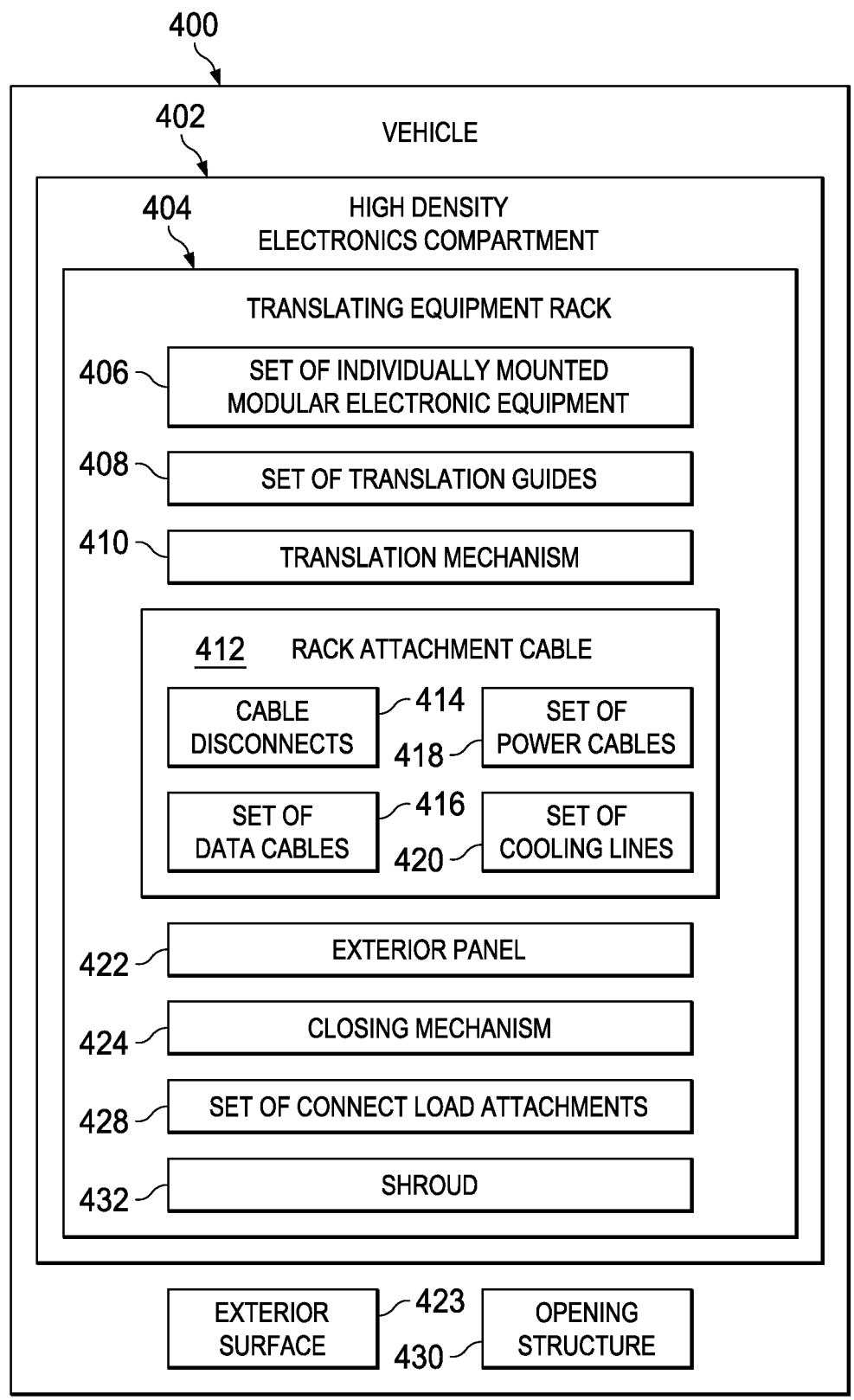
FIG. 4 is a block diagram of a vehicle having a translating equipment rack in accordance with an advantageous embodiment.

Turning now to FIG. 4, a block diagram of a vehicle having a translating equipment rack is shown in accordance with an advantageous embodiment. Vehicle 400 may be any type of vehicle. Vehicle 400 may be implemented as an aircraft, such as, without limitation, aircraft 200 in FIG. 2 or aircraft 300 in FIG. 3.

High density electronics compartment 402 may be an interior compartment within vehicle 400. High density electronics compartment 402 may be implemented as an electronic equipment bay in an aircraft, such as electronic equipment bay 214, 216, and 218 in FIG. 2.

High density electronics compartment 402 includes translating equipment rack 404. Translating equipment rack 404 may be an accessible equipment rack that can be accessed from outside of high density electronics compartment 402. In other words, personnel that are in an area that is external to high density electronics compartment 402 may access equipment within translating equipment rack 404 without entering high density electronics compartment 402.

Translating equipment rack 404 may be a support structure for set of individually mounted modular electronic equipment 406 within translating equipment rack 404.

Set of translation guides 408 may be connected to translating equipment rack 404. Set of translation guides 408 establishes a translation pathway for translation of translating equipment rack 404. Set of translation guides 408 may include support rods, a track, guide wires, guide rails, or any other type of guides for directing the translation pathway.

The translation movement of translating equipment rack 404 may be motivated or powered by translation mechanism 410. Translation mechanism 410 may be implemented as any type of translation mechanism. In one example, translation mechanism 410 may be implemented using a hand crank and/or a manually powered hand hoist system to raise and lower translating equipment rack 404.

In another example, translation mechanism 410 may be implemented as a rack and pinion translation system may utilize an electric or hydraulic motor to drive the translation movement.

Translation mechanism 410 in another embodiment may be implemented as an elevator system using a cable drive with translating equipment rack 404 supported in guide rails.

Translation mechanism 410 may also be implemented using long stroke hydraulic actuators with fluid supplied by a local hydraulic system.

In yet another example, translation mechanism 410 may be implemented as a re-circulating ball screw jack driven by an electric or hydraulic motor.

Translation mechanism 410 with set of translation guides 408 may direct translation of translating equipment rack 404 vertically with a powered vehicle mounted translation mechanism to lift and lower the translating equipment rack 404.

In another embodiment, translating equipment rack 404 may translate laterally to slide translating equipment rack 404 laterally outward.

In still another example, translation mechanism 410 moves translating equipment rack 404 diagonally to lift and lower the translating equipment rack 404 diagonally downward and upward.

Rack attachment cable 412 may be a transport mechanism for transporting data, electricity, or cooling lines through translating equipment rack 404. Rack attachment cable 412 may be flexible, semi-flexible, or rigid cable.

Rack attachment cable 412 connects translating equipment rack 404 with one or more sources of power, data, or cooling mediums located within vehicle 400. Rack attachment cable 412 may include cable disconnects 414. Cable disconnects 414 permit quick disconnect of rack attachment cable 412 from vehicle 400 to permit fast removal of translating equipment rack 404 from vehicle 400.

Rack attachment cable 412 may include set of data cables 416, set of power cables 418, and/or set of cooling lines 420. Set of data cables 416 may be one or more cables for transmitting input and/or output to and from set of individually mounted modular electronic equipment 406.

Set of power cables 418 may be cables delivering electric power to translating equipment rack 404 and/or set of individually mounted modular electronic equipment 406. Set of cooling lines 420 may be lines carrying coolant, water, or air for lowering a temperature of electronic devices in set of individually mounted modular electronic equipment 406.

Translating equipment rack 404 may be configured to be detachable from set of translation guides 408 and rack attachment cable 412 to permit detachment of translating equipment rack 404 from a high density electronics compartment 402. In other words, translating equipment rack 404 may be detached from high density electronics compartment 402 and vehicle 400 and removed.

Exterior panel 422 may be associated with exterior surface 423 of vehicle 400 and a high density electronics compartment 402. Exterior panel 422 may be coupled to translating equipment rack 404. Exterior panel 422 opens outward with rack translation to enable access to equipment within translating equipment rack 404.

Exterior panel 422 may be secured by closing mechanism 424 when exterior panel 422 is closed. Closing mechanism 424 may be implemented as any type of closing device, such as, but without limitation, a set of latches, a set of locks, or a set of pressure seals. If closing mechanism 424 may be implemented as a set of pressure seals, those pressure seals may include a set of pressure seals supporting seal interfaces. Pressure seals may not be implemented on sections of an aircraft or other vehicle that are not pressurized.

Set of connect load attachments 428 may be used to connect exterior panel 422 to opening structure 430 associated with exterior surface 423 of high density electronics compartment 402 when exterior panel 422 is closed.

Shroud 432 may be attached to translating equipment rack 404, exterior panel 422, and surrounding opening structure 430 associated with vehicle 400 to enclose and environmentally protect set of individually mounted modular electronic equipment 406 during exterior access.

Shroud 432 may be flexible, electrically conductive, and electrically grounded to vehicle 400 to provide electronic equipment in translating equipment rack 404 with electromagnetic energy protection, including but not limited to, shielding protection.

FIG. 4 is intended as an example, and not as an architectural limitation for the different advantageous embodiments.

Figure 5:
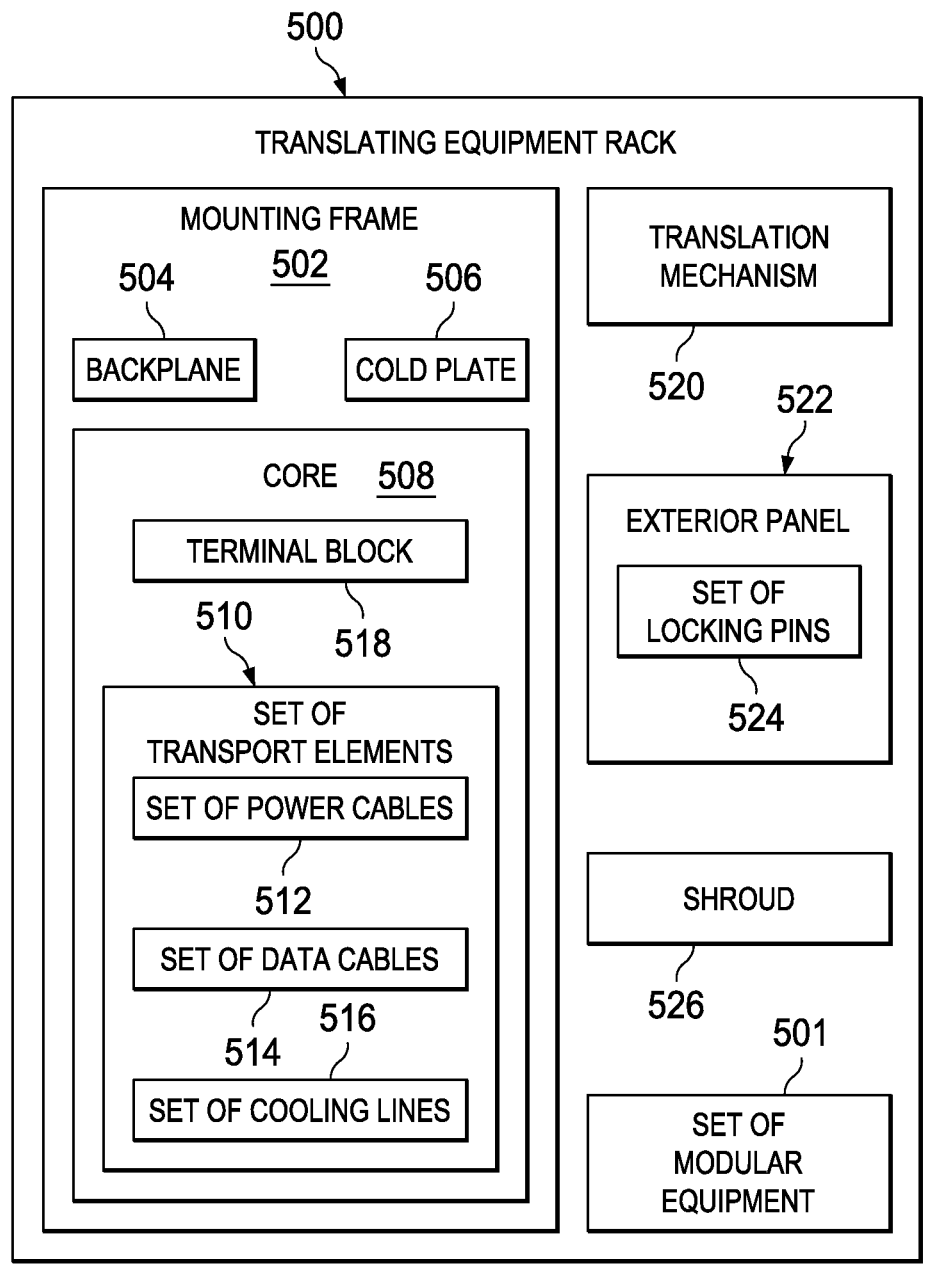
FIG. 5 is a block diagram of a translating equipment rack in accordance with an advantageous embodiment.

FIG. 5 is a block diagram of a translating equipment rack in accordance with an advantageous embodiment. Translating equipment rack 500 may be a rack for supporting set of modular equipment 501. In this example, translating equipment rack 500 may be installed within a high density electronics compartment of an aircraft, such as, without limitation, electronic equipment bay 214, 216, or 218 in FIG. 2 and high density electronics compartment 320 in FIG. 3. However, translating equipment rack 500 in other embodiments may be installed within any type of vehicle.

Translating equipment rack 500 may be moved along a translation pathway into and out of a high density electronics compartment. This translating movement permits personnel to access set of modular equipment 501 without entering the vehicle.

Mounting frame 502 provides a framework to support equipment mounted within translating equipment rack 500. Mounting frame 502 may also provide the framework for supporting backplane 504 for electrical equipment and cold plate 506.

Cold plate 506 may be utilized within translating equipment rack 500 for cooling. Cold plate 506 removes heat by convection. Cold plate 506 may use liquid as the means to transport the heat away from electronic equipment in set of modular equipment 501. A liquid pump associated with cold plate 506 may be electrically powered from a main electrical distribution system. The liquid may be cooled by a heat exchanger installed in the aircraft ram air duct. This has the advantage of reducing the quantity of heat laden air in the airframe easing thermal management.

Mounting frame 502 may be configured having a square section metallic core 508. Core 508 may be hollow to lessen the weight of translating equipment rack 500. Core 508 may be hollow to allow set of transport elements 510 to be installed within core 508. In other words, set of transport elements 510 may run through the hollow core 508. Running set of transport elements 510 through the hollow core 508 may also provide additional protection to protect set of transport elements 510 from external damage.

Set of transport elements 510 may include set of power cables 512. Set of power cables 512 provide an electrical connection between a vehicle and electrical equipment in translating equipment rack 500.

Set of data cables 514 provides a connection for input and output of data to and from electrical equipment within translating equipment rack 500 and other systems associated with the vehicle within which translating equipment rack 500 may be located.

Set of cooling lines 516 may provide a liquid cooling system for thermal management of equipment mounted within translating equipment rack 500.

Core 508 may be produced from metal that enables an integral local electrical ground to be connected to the aircraft ground plane for Electro-Magnetic Effects (EME) protection. Terminal block 518 may also be located at the top of core 508 for the rack mounted transport elements. Terminal block 518 may be an initial interface with the airframe mounted in set of transport elements 510.

Translation mechanism 520 may be a mechanism to move translating equipment rack 500 along a translation pathway from an interior area of a compartment outward to an exterior area, such as translation mechanism 410 in FIG. 4. In other words, translation mechanism 520 allows vertical or lateral translation of translating equipment rack 500.

For example, translation mechanism 520 may move translating equipment rack 500 sideways along a horizontal translation pathway, up and down along a diagonal translation pathway to lift and lower the translating equipment rack, and/or up and down along a vertical translation pathway to lift and lower translating equipment rack 500.

Exterior panel 522 may be a door or fuselage hatch for closing an opening in the structure of the aircraft to allow translating equipment rack 500 to enter and exit the aircraft's electronic equipment bay area. Exterior panel 522 may be implemented as a panel, such as, exterior panel 422 in FIG. 4.

In one embodiment exterior panel 522 may be an integral part of translating equipment rack 500. In another embodiment, exterior panel 522 may be unattached to translating equipment rack 500. In other words, exterior panel 522 may be attached to a vehicle, such as an aircraft, without being integrally attached to translating equipment rack 500. Exterior panel 522 may be sealed shut using a closing mechanism, such as pressure locks and/or locking pins, such as, without limitation, set of locking pins 524.

Set of locking pins 524 may include a plurality of electrically actuated locking pins. Exterior panel 522 may require infrequent access. Therefore, set of locking pins 524 may include multiple pins and fail safe load paths. Set of locking pins 524 may use a power operated solenoid to unlock and retract each pin. When no power is applied, the pins in set of locking pins 524 remain locked. Thus, any decrease in power availability will not lead to an un-commanded extension of translating equipment rack 500. In another embodiment, set of locking pins 524 may be unlocked manually by using a lever or a tool thus not requiring power.

In another embodiment, exterior panel 522 may be located close to passenger and cargo doors. This reduces the amount of structural reinforcement as the door opening structure will provide some of the local strengthening of the additional cut outs required.

Shroud 526 may be an integral cover attached to translating equipment rack 500 and exterior panel 522. Shroud 526 may be manufactured from any material or combination of materials that provide either a rigid, semi-rigid or fully flexible cover.

Shroud 526 provides protection to set of modular equipment 501 mounted within translating equipment rack 500 during access from the exterior area. Shroud 526 may also provide the additional function of offering electromagnetic effects (EME) protection both as an induced current shield and as environmental protection from High Intensity Radiated Fields (HIRF).

FIG. 5 is intended as an example, and not as an architectural limitation for the different advantageous embodiments.

Figure 6:
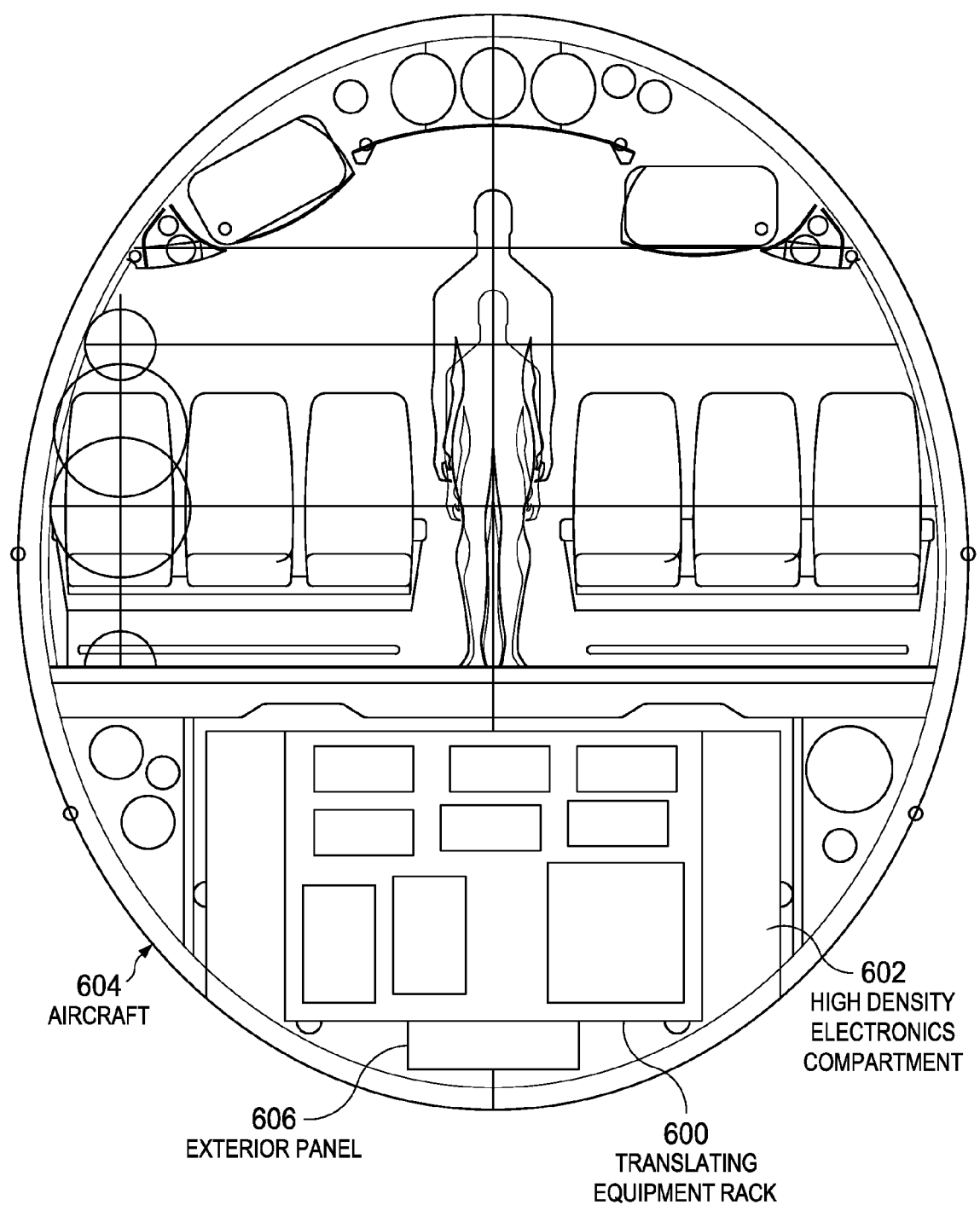
FIG. 6 is a cross section of an electronic equipment bay having a translating equipment rack in accordance with an advantageous embodiment.

FIG. 6 is a cross section of an electronic equipment bay having a translating equipment rack in accordance with an advantageous embodiment. Translating equipment rack 600 may be a rack having a set of electronic equipment mounted within the rack. Translating equipment rack 600 is an accessible equipment rack. Translating equipment rack 600 may be implemented as an equipment rack having a translation mechanism, such as translating equipment rack A 324 and translating equipment rack B 330 in FIG. 3, translating equipment rack 404 in FIG. 4, and translating equipment rack 500 in FIG. 5.

Translating equipment rack 600 may be capable of being moved vertically downwards and out of high density electronics compartment 602 of aircraft 604. Exterior panel 606 may be, without limitation, an integral component of translating equipment rack 600.

FIG. 6 is intended as an example, and not as an architectural limitation for the different advantageous embodiments.

Figure 7:
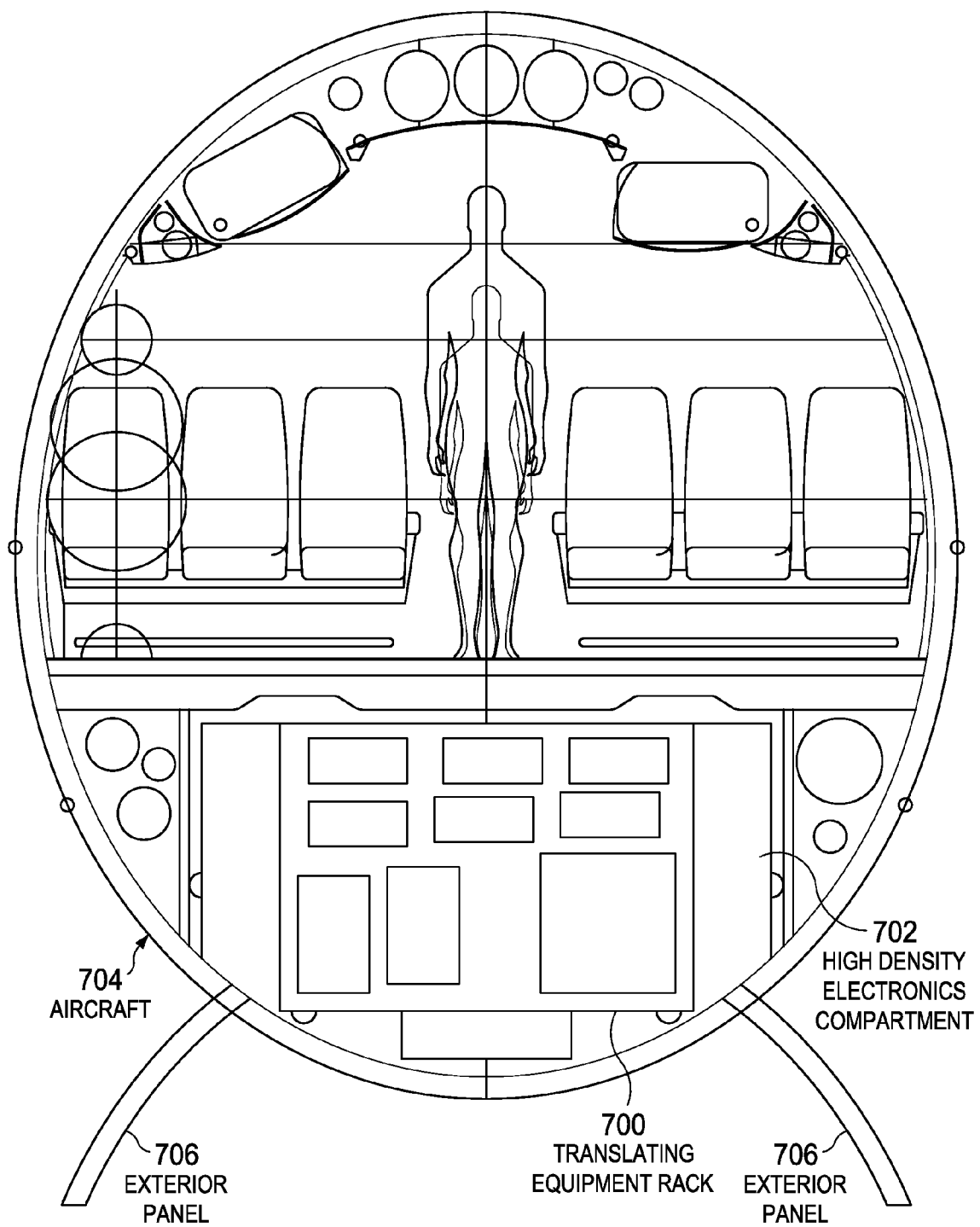
FIG. 7 is a cross section of a translating equipment rack associated with hinged door exterior panels in accordance with an advantageous embodiment.

FIG. 7 is a cross section of a translating equipment rack associated with hinged door exterior panels in accordance with an advantageous embodiment.

Translating equipment rack 700 may be a rack having a set of electronic equipment mounted within the rack. Translating equipment rack 700 may be implemented as an equipment rack having a translation mechanism, such as translating equipment rack A 324 and translating equipment rack B 330 in FIG. 3, translating equipment rack 404 in FIG. 4, and translating equipment rack 500 in FIG. 5.

Translating equipment rack 700 may be capable of being moved vertically downwards and out of high density electronics compartment 702 of aircraft 704. Exterior panels 706 in this embodiment are hinged doors. Exterior panels 706 are an integral component of aircraft 704. Exterior panels 706 are not integral components of translating equipment rack 700 in this example.

Exterior panels 706 provide a sealed environment for high density electronics compartment 702. Exterior panels 706 provide additional environmental protection when translating equipment rack 700 is extended.

FIG. 7 is intended as an example, and not as an architectural limitation for the different advantageous embodiments.

Figure 8:
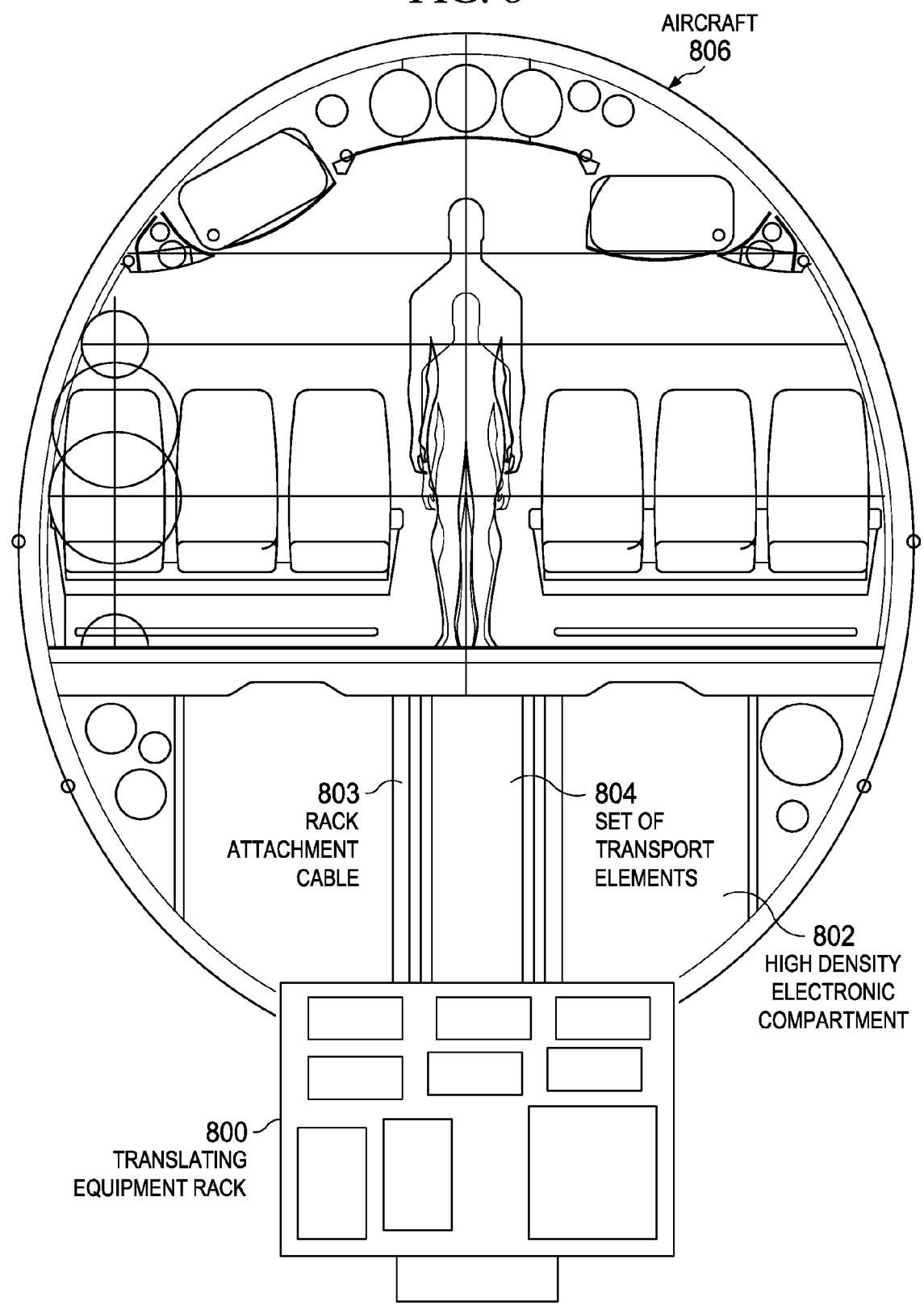
FIG. 8 is a cross section of a translating equipment rack translated vertically downward in accordance with an advantageous embodiment.

FIG. 8 is a cross section of a translating equipment rack translated vertically downward in accordance with an advantageous embodiment. Translating equipment rack 800 may be a rack having a set of electronic equipment mounted within the rack. Translating equipment rack 800 may be implemented as an equipment rack having a translation mechanism, such as translating equipment rack A 324 and translating equipment rack B 330 in FIG. 3, translating equipment rack 404 in FIG. 4, and translating equipment rack 500 in FIG. 5.

Translating equipment rack 800 is shown in a lowered position. Translating equipment rack 800 has been translated downward and out of high density electronics compartment 802 to provide personnel with external access to equipment mounted within translating equipment rack 800.

Rack attachment cable 803 may be an umbilical type of cable housing a set of transport elements 804. Rack attachment cable 803 connects translating equipment rack 800 to systems of aircraft 806. Rack attachment cable 803 enclosing a set of transport elements 804 may be implemented as, without limitation, rack attachment cable 412 in FIG. 4. Rack attachment cable 803 may be enclosing a set of transport elements, such as set of transport elements 510 in FIG. 5. The set of transport elements 804 enclosed within cable 803 may include data cables, power cables, and/or cooling lines.

FIG. 8 is intended as an example, and not as an architectural limitation for the different advantageous embodiments.

Figure 9:
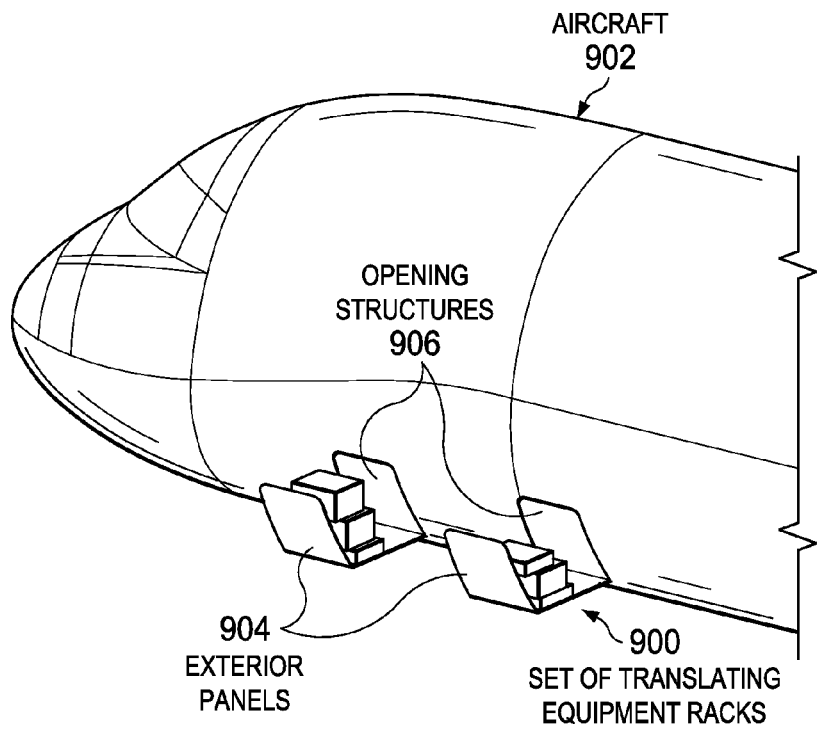
FIG. 9 is a diagram of a set of translating equipment racks translated laterally in accordance with an advantageous embodiment.

FIG. 9 is a diagram of a set of translating equipment racks translated laterally in accordance with an advantageous embodiment. Set of translating equipment racks 900 may be implemented as equipment racks having a translation mechanism, such as translating equipment rack A 324 and translating equipment rack B 330 in FIG. 3, translating equipment rack 404 in FIG. 4, translating equipment rack 500 in FIG. 5, and translating equipment rack 600 in FIG. 6.

Set of translating equipment racks 900 are translated laterally outside of an electronic equipment bay of aircraft 902. Set of translating equipment racks 900 translate laterally with their coupled exterior panels 904 through opening structures 906 in aircraft 902.

However, in another embodiment, exterior panels 904 may not be coupled to set of translating equipment racks 902. In such case, exterior panels 904 may not translate with set of translating equipment racks 900.

Figure 10:
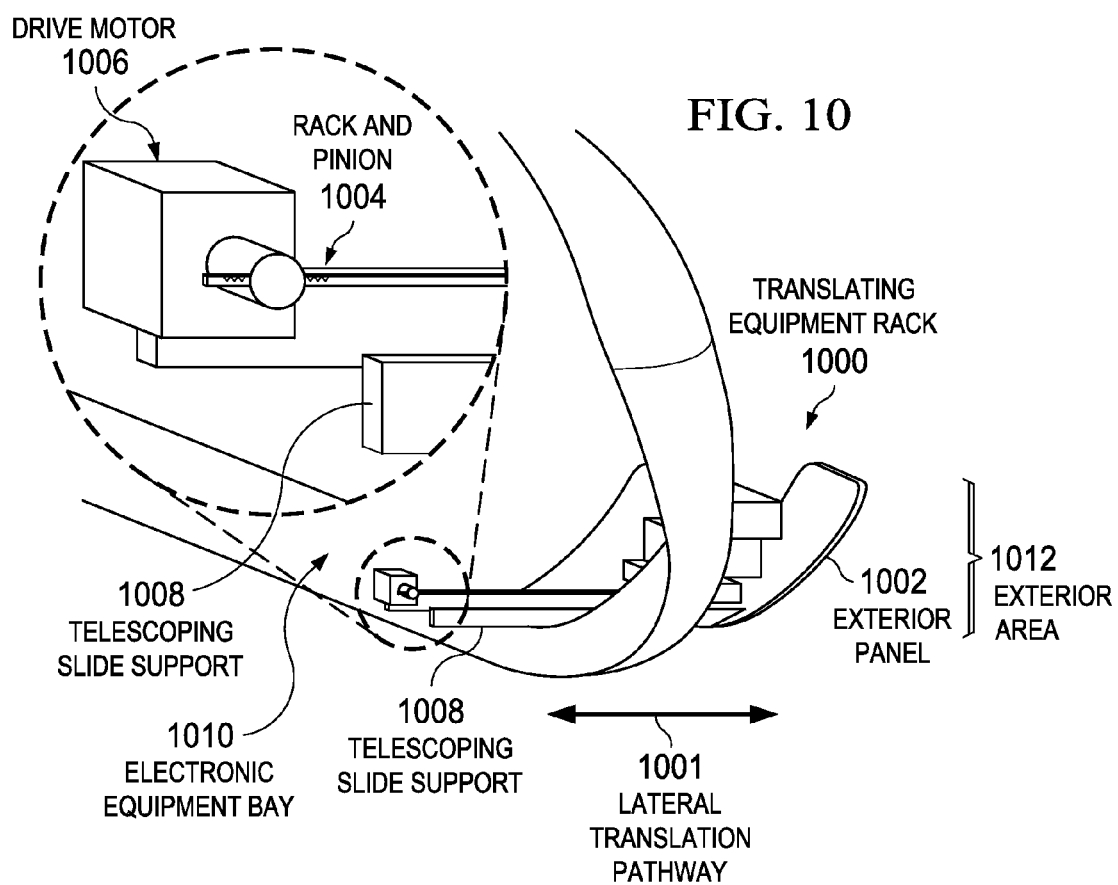
FIG. 10 is a diagram of a laterally translated equipment rack in accordance with an advantageous embodiment.

FIG. 10 is a diagram of a laterally translated equipment rack in accordance with an advantageous embodiment. Translating equipment rack 1000 may be implemented as equipment racks having a translation mechanism, such as translating equipment rack A 324 and translating equipment rack B 330 in FIG. 3, translating equipment rack 404 in FIG. 4, translating equipment rack 500 in FIG. 5, translating equipment rack 600 in FIG. 6, and translating equipment rack 900 in FIG. 9.

Translating equipment rack 1000 translates laterally sideways along lateral translation pathway 1001. Translating equipment rack 1000 translates laterally with exterior panel 1002 coupled on translating equipment rack 1000, in this example.

Rack and pinion 1004 driven by drive motor 1006 is a translation mechanism that moves translation equipment rack 1000 along lateral translation pathway 1001. Drive motor 1006 may be implemented as an electric drive motor, a hydraulic drive motor, or any other type of motor.

However, translating equipment rack 1000 is not limited to implementation with a rack and pinion translation mechanism. Translating equipment rack 1000 may be implemented using any other type of translating mechanism for moving translating equipment rack 1000 along lateral translation pathway 1001, such as, without limitation, a hydraulic motor, a manual translation mechanism, such as a hand powered crank, or any other translation mechanism that is known or may become available.

Translating equipment rack 1000 moves sideways along telescoping slide support 1008. Telescoping slide support 1008 acts as translation guides, such as, without limitation, set of translation guides 408 in FIG. 4. Telescoping slide support 1008 guides movement of translating equipment rack 1000 along lateral translation pathway 1001.

Translating equipment rack 1000 moves laterally outside of electronic equipment bay 1010 and into exterior area 1012 to permit exterior access to equipment stored within translating equipment rack 1000.

FIG. 10 is intended as an example, and not as an architectural limitation for the different advantageous embodiments.

Figure 11:
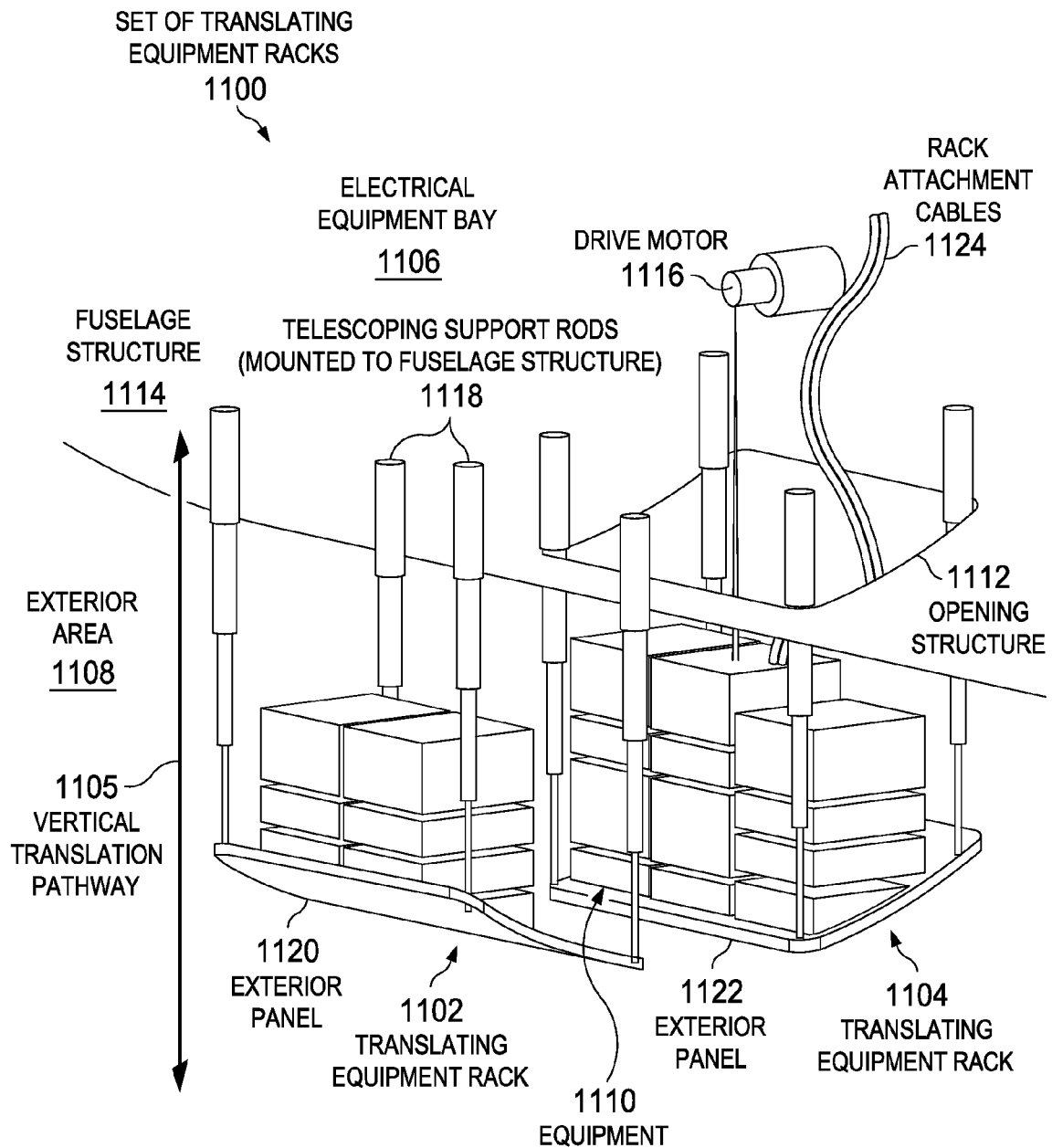
FIG. 11 is a diagram of a set of vertically translating equipment racks in accordance with an advantageous embodiment.

FIG. 11 is a diagram of a set of vertically translating equipment racks in accordance with an advantageous embodiment. Set of translating equipment racks 1100 may includes translating equipment racks 1102 and 1104.

Translating equipment racks 1102 and 1104 are racks having a set of electronic equipment mounted within them. Translating equipment racks 1102 and 1104 in this example move along vertical translation pathway 1105.

Translating equipment racks 1102 and 1104 may be implemented as an equipment rack having a translation mechanism, such as translating equipment rack 324 and 330 in FIG. 3, translating equipment rack 404 in FIG. 4, translating equipment rack 500 in FIG. 5, translating equipment rack 600 in FIG. 6, and translating equipment rack 700 in FIG. 7.

Translating equipment racks 1102 and 1104 have been translated vertically downward out of electronic equipment bay 1106 and into an exterior area 1108 to permit access to equipment 1110 in set of translating equipment racks 1100. In this example, an exterior area is an area exterior to electronic equipment bay 1106. Equipment in translating equipment racks 1102 and 1104 may be accessed from an area that is outside or external to electronic equipment bay 1106. Thus, personnel may access electrical equipment without entering electronic equipment bay 1106.

Translating equipment racks 1102 and 1104 translate vertically out through opening structure 1112 in fuselage structure 1114 along vertical translation pathway 1105. Drive motor 1116 is a translation mechanism for moving set of translating equipment racks 1100 up and down along vertical translation pathway 1105. Telescoping support rods 1118 guide movement of set of translating equipment racks 1100 along vertical translation pathway 1105.

However, the advantageous embodiments are not limited to implementation of set of translating equipment racks 1100 with a drive motor for a translation mechanism. The advantageous embodiments may be implemented using any type of translation mechanism, such as, without limitation, a hydraulic motor, an electric motor, a hand powered crank, or any other translation mechanism that is known or may become available.

In this example, translating equipment rack 1102 includes exterior panel 1120 coupled on a frame of translating equipment rack 1102. Thus, exterior panels 1120 and 1122 move with their corresponding translating equipment racks 1102 and 1104. However, in another advantageous embodiment, exterior panel 1120 may not be coupled on translating equipment rack 1102. Instead, exterior panel 1120 may be coupled on other structures, such as, for example and without limitation, fuselage structure 1114 or opening structure 1112.

Rack attachment cable 1124 is a cable enclosing a set of transport elements such as, without limitation, data cables, power cables, and cooling lines. Rack attachment cable 1124 may be implemented as, without limitation, rack attachment cable 412 in FIG. 4 and rack attachment cable 803 in FIG. 8. Rack attachment cable 803 may comprise a set of transport elements, such as, without limitation, set of transport elements 510 in FIG. 5.

In the advantageous embodiment shown in FIG. 11, translating equipment racks 1102 and 1104 move down vertically to exterior area 1108. However, in another advantageous embodiment, a translating equipment rack may move vertically upward to move out of electronic equipment bay 1106 and into exterior area 1108. In this case, the translating equipment rack may move vertically downward to return to electronic equipment bay 1106.

FIG. 11 is intended as an example, and not as an architectural limitation for the different advantageous embodiments.

For example, exterior panels 1120 and 1122 may not be integral to set of translating equipment racks 1100. Exterior panels 1120 and 1122 may be implemented as separate doors or hatches that are unattached to set of translating equipment racks 1100.

Figure 12:
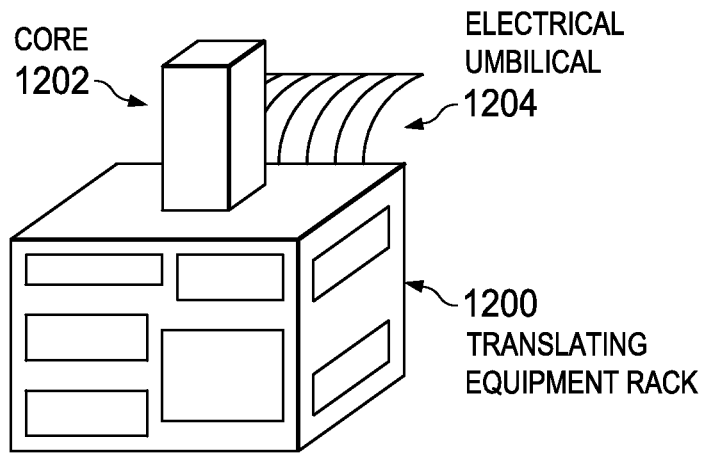
FIG. 12 is a diagram of a translating equipment rack core in accordance with an advantageous embodiment.

FIG. 12 is a block diagram of a translating equipment rack core in accordance with an advantageous embodiment. Translating equipment rack 1200 may be implemented as equipment racks having a translation mechanism, such as translating equipment rack A 324 and translating equipment rack B 330 in FIG. 3, translating equipment rack 404 in FIG. 4, translating equipment rack 500 in FIG. 5, translating equipment rack 600 in FIG. 6, translating equipment rack 700 in FIG. 7, translating equipment rack 800 in FIG. 8, and translating equipment rack 900 in FIG. 9.

Core 1202 may be a hollow core enclosing an umbilical such as, without limitation, core 508 in FIG. 5. Electrical umbilical 1204 may be electrical cables enclosed within a rack attachment cable, such as rack attachment cable 412 in FIG. 4, rack attachment cable 803 in FIG. 8, and rack attachment cable 1124 in FIG. 11.

Figure 13:
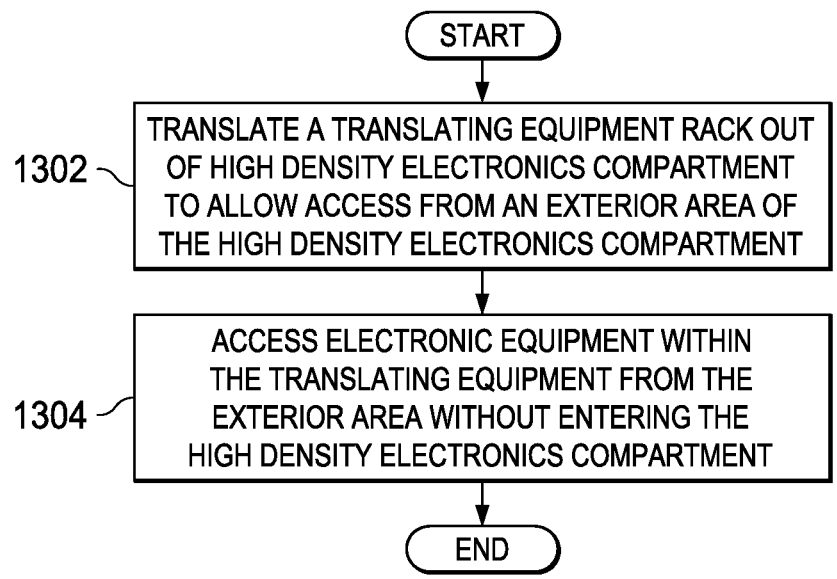
FIG. 13 is an illustration of a flowchart of a process for accessing an electronic equipment rack in accordance with an advantageous embodiment.

FIG. 13 is an illustration of a flowchart of a process for accessing an electronic equipment rackhigh density electronics compartment in accordance with an advantageous embodiment.

The process illustrated in FIG. 13 may be implemented by a translation mechanism, such as translation mechanism 410 in FIG. 4 or translation mechanism 520 in FIG. 5. The process may also be implemented by a human technician or other maintenance personnel.

The process begins by translating a translating equipment rack out of a high density electronics compartment to allow access from an exterior area of the high density electronics compartment (operation 1302).

The process accesses electronic equipment within the translating equipment rack from the exterior area without entering the high density electronics compartment (operation 1304) with the process terminating thereafter.

The process in FIG. 13 is described as being implemented within a high density electronics compartment. However, the advantageous embodiments may be implemented within any type of compartment containing electronic equipment.

The advantageous embodiments provide a translating equipment rack system. In one embodiment, the translating equipment rack includes a mounting frame having a set of transport elements and a translation mechanism. The translation mechanism moves the translating equipment rack along a translation pathway from an interior area of a compartment outward to an exterior area outside the compartment to enable access to the translating equipment rack from the exterior area.

In another embodiment, a high density electronics compartment includes a translating equipment rack. The translating equipment rack has a set of individually mounted modular electronic equipment within the translating equipment rack. A set of translation guides may be connected to the translating equipment rack. The translating equipment rack includes a flexible rack attachment cable with cable disconnects. The translating equipment rack includes a cover that protects the equipment from the environment when outside of the vehicle and may be electrically connected to the rack so as to provide protection against electromagnetic effects. An exterior panel associated with a surface of the high density electronics compartment may be coupled to the translating equipment rack and open outward with rack translation to enable access to the translating equipment rack and the set of modular electronic equipment within the translating equipment rack.

The exterior panel may be secured with latches or locks and in pressurized areas of the vehicle have a pressure supporting seal interface when closed. The rack may also contain an electromagnetic effect or environmental shroud.

Thus, the advantageous embodiments provide a translating systems rack that may be removed from the aircraft as a single unit for installation or servicing. The advantageous embodiments permit greater access to system line replaceable units. The embodiments decrease the internal space utilized by equipment and other systems in storage bay areas on an aircraft. The translating equipment rack may be extended from an aircraft body to increase accessibility to systems for build and maintenance.

A set of one or more translating equipment racks allows for all the equipment in an electronic equipment bay of an aircraft to be lowered from the aircraft. The translating equipment rack may be lowered from the aircraft without requiring any internal access for build or maintenance operations.

As line replaceable units and other electronic equipment mounted within a translating equipment rack may be translated to a position external to the aircraft, access to the line replaceable units and electronic equipment is simplified. This reduces the financial impacts of serviceability and maintenance of line replaceable units and electronic equipment. Mechanics may move translating equipment racks to a position outside an electronic equipment bay so that they can stand up and install or service the equipment mounted on the translating equipment rack. Lights and entire test stands can be rolled up to the aircraft right next to the translating equipment rack so that maintenance may be performed without having to remove them from the aircraft. The embodiments provide a single connection for power and cooling to the airframe but is not limited to a single connection. The embodiments allow for the electronic equipment bay to be designed as an integral system that can be raised and lowered into the aircraft. The integrated cube also allows for easier access, improved serviceability, and increased packaging efficiency since all components are one item deep and a removable translating equipment rack may be packed to a higher density factor than non-translating equipment racks.

The features and functions of the embodiments may provide an added advantage to aircraft and other vehicle design because the translating equipment rack allows electronic equipment to be packaged and mounted within a smaller space. Because elements of the high density electronics compartment may be packaged in a smaller volume, the translating equipment racks may be located in areas of an aircraft that are not currently being used for electronic equipment, such as a tail section of an aircraft.

Moreover, electronic equipment may be stored in areas not currently being used for electronic equipment that may be less likely to encounter problems or potential damage from such things as, without limitation, engine rotor burst zones and oxygen bottles. Thus, translating equipment racks provide increased aircraft and equipment safety.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An aircraft comprising: a fuselage comprising; an accessible equipment rack within the fuselage, the accessible equipment rack comprising: an external panel that forms part of an outer surface of the fuselage when the accessible equipment rack is fully within the fuselage; a set of telescoping support rods mounted to the fuselage and also connected to a translating equipment rack, wherein said translating equipment rack is configured to be detachable from said set of telescoping support rods; and a translation mechanism configured to move said translating equipment rack along a vertical translation pathway from within the fuselage to enable access to said translating equipment rack from an exterior area relative to the fuselage, and wherein the translating equipment rack is configured to completely separate from the fuselage after translation; a translation pathway, wherein said translation mechanism moves said translating equipment rack along said translation pathway from an interior area of a compartment into said exterior area of said compartment; a flexible rack attachment cable connected to said translating equipment rack, wherein said flexible rack attachment cable remains connected to said translating equipment rack during translation of translating equipment rack; a set of cable disconnects connected to said flexible rack attachment cable to permit removal of the translating equipment rack; electronics connected to the translating equipment rack, wherein the electronics comprises a set of modular, high-density electronic equipment; a set of cooling lines connected between the aircraft and the set of modular, high-density electronic equipment; a set of power lines connected between the aircraft and the set of modular, high-density electronic equipment; an electrically conductive flexible shroud being grounded to said aircraft and disposed around the electronics to protect the electronics during translating access from the exterior area; and a plurality of translating sub-racks mounted within said translating equipment rack, wherein each translating sub-rack within said plurality of translating sub-racks comprises a set of individually mounted modular electronic equipment within said translating sub-rack, the set of individually mounted modular electronic equipment being part of the set of modular, high-density electronic equipment, wherein at least one modular electronic equipment in said set of individually mounted modular electronic equipment within said translating sub-rack is exposed and removable on a side of said translating sub-rack next to an adjacent translating sub-rack which remains unexposed within said translating equipment rack.

2. The aircraft of claim 1, wherein said translating equipment rack is mounted within a tail section of said aircraft.

3. The aircraft of claim 1, wherein the translation mechanism comprises a drive motor.

4. The aircraft of claim 1, wherein the translation mechanism comprises a hydraulic motor.

5. The aircraft of claim 1, wherein the translation mechanism comprises an electric motor.

6. The aircraft of claim 1, wherein the translation mechanism comprises a hand powered crank.

\* \* \* \* \*